United States Patent
Arima

[11] Patent Number: 5,939,758
[45] Date of Patent: Aug. 17, 1999

[54] SEMICONDUCTOR DEVICE WITH GATE ELECTRODES HAVING CONDUCTIVE FILMS

[75] Inventor: Satoshi Arima, Hyogo, Japan

[73] Assignee: Mitsubishi Denki Kabushiki Kaisha, Tokyo, Japan

[21] Appl. No.: 08/862,650

[22] Filed: May 23, 1997

[30] Foreign Application Priority Data

Nov. 25, 1996 [JP] Japan ................................. 8-313674

[51] Int. Cl.$^6$ .......................... H01L 29/76; H01L 29/94; H01L 31/113; H01L 31/119
[52] U.S. Cl. ...................... 257/377; 257/382; 257/383; 257/384; 257/396; 257/412; 257/413
[58] Field of Search ................... 257/412, 413, 257/377, 382, 383, 384, 396

[56] References Cited

U.S. PATENT DOCUMENTS

| | | | |
|---|---|---|---|
| 4,855,245 | 8/1989 | Neppl et al. ............................. | 437/31 |
| 5,059,554 | 10/1991 | Spinner et al. ......................... | 437/193 |
| 5,221,853 | 6/1993 | Joshi et al. ............................. | 257/384 |
| 5,241,207 | 8/1993 | Toyoshima et al. .................... | 257/384 |
| 5,483,104 | 1/1996 | Godinho ................................ | 257/758 |
| 5,654,575 | 8/1997 | Jeng ....................................... | 257/384 |
| 5,656,861 | 8/1997 | Godinho et al. ....................... | 257/758 |
| 5,703,391 | 12/1997 | Arima .................................... | 257/382 |
| 5,723,893 | 3/1998 | Yu et al. ................................. | 257/413 |
| 5,801,427 | 9/1998 | Shiratake et al. ...................... | 257/412 |

FOREIGN PATENT DOCUMENTS

| | | |
|---|---|---|
| 3-129725 | 6/1991 | Japan . |
| 6-53234 | 2/1994 | Japan . |
| 8-55852 | 7/1996 | Japan . |

*Primary Examiner*—William Mintel
*Attorney, Agent, or Firm*—McDermott, Will & Emery

[57] ABSTRACT

First and second gate electrodes are formed spaced from each other on a semiconductor substrate. A pair of impurity diffusion layers are provided on both sides of the first gate electrode at the surface of the semiconductor substrate. The first gate electrode includes a first lower conductive film, a first protective conductive film provided on the first lower conductive film, and a first upper conductive film provided on the first protective conductive film. The second gate electrode includes a second lower conductive film, a second protective conductive film provided on the second lower conductive film, and a second upper conductive film provided on the second protective conductive film. The second upper conductive film extends to be in contact with one of the pair of impurity diffusion layers.

5 Claims, 5 Drawing Sheets

SEMICONDUCTOR DEVICE WITH GATE ELECTRODES HAVING CONDUCTIVE FILMS

BACKGROUND OF THE INVENTION

1. Field of the Invention

The present invention generally relates to a semiconductor device and, more specifically, to an MOS type semiconductor device wherein a gate electrode of one transistor is directly connected to an impurity diffusion layer of adjacent transistor. The present invention also relates to a method of manufacturing such a semiconductor device.

2. Description of the Background Art

A structure in which a gate electrode of one MOS transistor is electrically connected to a source or drain region of another, adjacent transistor has been used in a semiconductor memory device, such as an SRAM. Such a structure is employed to enable electrical connection while improving the degree of integration. More specifically, a polycrystalline silicon film providing the gate electrode of one transistor is used as an interconnection, which interconnection is directly connected to a source or drain region of another, adjacent transistor, whereby the degree of integration is improved.

FIG. 8 is a cross sectional view of a conventional semiconductor device having such a structure.

Referring to FIG. 8, an isolation insulating film 2 which serves as an element isolating region is formed at a main surface of a semiconductor substrate 1 of silicon single crystal. In an element region surrounded by isolation insulating film 2, an MOS transistor 3 is formed. MOS transistor 3 includes impurity diffusion layers 4a and 4b which will be the source and drain regions, formed in the main surface of semiconductor substrate 1. MOS transistor 3 includes a gate electrode 6a formed on semiconductor substrate 1 with a gate oxide film 5 interposed. Gate electrode 6a includes two layers, that is, first polycrystalline silicon film 7a and a second polycrystalline silicon film 8a. Next to MOS transistor 3, an adjacent MOS transistor is formed, which includes a gate electrode 6b consisting of two layers, that is, a first polycrystalline silicon film 7b and a second polycrystalline silicon film 8b. An end portion of the second polycrystalline silicon film 8b of the adjacent MOS transistor extends and is in contact with one impurity diffusion layer 4b of MOS transistor 3. The portion where impurity diffusion layer 4b is in contact with the second polycrystalline silicon 8b is referred to as a direct contact region 9.

The method of manufacturing the conventional semiconductor device above will be described. Referring to FIG. 9, isolation insulating film 2 is formed by using LOCOS method at the main surface of semiconductor substrate 1. On the entire surface of semiconductor substrate 1, a gate oxide film 5 is formed by thermal oxidation. Thereafter, on the entire surface of semiconductor substrate 1, a conductive first polycrystalline silicon film 7 doped with an impurity is deposited.

Referring to FIG. 10, by using a resist pattern 10 patterned by photolithography as a mask, an underlying first polycrystalline silicon film 7 is selectively removed by etching, for example by ion etching. By this etching removal, part of the gate oxide film 5 is exposed at the same time, as shown in the figure.

Referring to FIGS. 10 and 11, resist pattern 10 is removed. By wet etching using hydrofluoric acid, the exposed portion of gate oxide film 5 is removed. By this step, direct contact region 9 is formed. At this time, as will be described later, water marks 30 are formed on a surface of second polycrystalline silicon film 7.

Referring to FIG. 12, on the entire surface of semiconductor substrate 1, a conductive second polycrystalline silicon film 8 doped with an impurity is deposited. On the second polycrystalline silicon film 8, a photoresist film is formed, which is patterned by photolithography, and thus a resist pattern 11 is formed.

Referring to FIGS. 12 and 13, using resist pattern 11 as a mask, the second polycrystalline silicon film 8 and the first polycrystalline silicon film 7 are selectively removed by etching, by ion etching. Consequently, a gate electrode 6a consisting of the first polycrystalline silicon film 7a and the second polycrystalline silicon film 8a formed thereon, as well as a gate electrode 6b consisting of the first polycrystalline silicon film 7b and the second polycrystalline silicon film 8b formed thereon are provided. Patterning of the second polycrystalline silicon film 8 is performed such that an extended portion of the second polycrystalline silicon film 8b is left on the contact region 9 as shown in the figure.

After removal of resist pattern 11, an impurity is introduced from above semiconductor substrate 1 by ion implantation. Thereafter, by thermal processing, impurity diffusion layers 4a and 4b of MOS transistor 3 are formed. In this thermal processing, impurity diffuses also from the second polycrystalline silicon film 8b formed in contact with the surface of semiconductor substrate 1 into semiconductor substrate 1. Diffused impurity and implanted impurity are integrated, forming impurity diffusion layer 4b which comes to be directly in contact with gate electrode 6b at direct contact region 9. Thereafter, through prescribed processes, a semiconductor device is completed. The conventional semiconductor device manufactured through the above described steps suffers from the following problem.

Namely, when the gate oxide film 5 is selectively removed by etching and direct contact region 9 is formed as shown in FIG. 11, the semiconductor substrate 1 is subjected to wet etching using hydrofluoric acid. At this time the first polycrystalline silicon film 7 serving as the etching mask is exposed to the etchant and after drying, water marks are generated on its surface. Water marks 30 are of silicon oxide including a compound of Si, $O_2$ and $H_2O$, which marks are left as stripe-shaped stain after drying. The water marks function as a mask for etching when gate electrodes 6a and 6b are formed by patterning in the steps shown in FIGS. 12 and 13, which may possibly cause pattern defects in gate electrodes 6a and 6b.

A method of using dry etching which does not generate any water mark is also known as a method of etching removal of gate oxide film 5. However, dry etching damages silicon substrate 1, causing degradation of device characteristics.

SUMMARY OF THE INVENTION

Therefore, an object of the present invention is an improved a semiconductor device having a gate electrode of one transistor directly connected to an impurity diffusion layer of another transistor, so as to prevent degradation of device characteristics and the like.

Another object of the present invention is an improved method of manufacturing a semiconductor device having a gate electrode of one transistor directly connected to an impurity diffusion layer of another transistor, so as to prevent the generation of a pattern detect in the gate electrode.

Another object of the present invention is to provide a highly reliable semiconductor device manufactured through such method.

The semiconductor device in accordance with the first aspect of the present invention includes a semiconductor substrate. On the semiconductor substrate, first and second gate electrodes are formed spaced from each other. A pair of impurity diffusion layers are provided on both sides of the first gate electrode, at the surface of the semiconductor substrate. The first gate electrode includes a first lower conductive film, a first protective conductive film provided on the first lower conductive film, and a first upper conductive film provided on the first protective conductive film. The second gate electrode includes a second lower conductive film, a second protective conductive film provided on the second lower conductive film, and a second upper conductive film provided on the second protective conductive film. The second upper conductive film extends to be in contact with one of the pair of impurity diffusion layers.

According to a preferred embodiment of the present invention, a gate oxide film is provided between the first gate electrode and the semiconductor substrate, and the gate oxide film is formed such that an end portion of the gate oxide film is spaced from an end portion of the extended portion of the second upper conductive film which is in contact with the impurity diffusion layer.

According to a further preferred embodiment of the present invention, a metal silicide film is further provided on each of the first and second upper conductive films.

According to a second aspect of the present invention, the present invention relates to a method of manufacturing a semiconductor device having a first gate electrode including a first lower conductive film, a first protective conductive film and a first upper conductive film stacked in this order, and a second gate electrode including a second lower conductive film, a second protective conductive film and a second upper conductive film stacked in this order. On a semiconductor substrate, a gate oxide film, a first conductive layer and a protective conductive layer are formed in this order. The gate oxide film, the first conductive layer and the protective conductive layer are selectively wet-etched, whereby the first gate electrode including the first lower conductive film and the first protective conductive film and the second gate electrode including the second lower conductive film and the second protective conductive film are formed spaced from each other on the semiconductor substrate, and further that portion of the semiconductor substrate which is between the first and second gate electrodes is exposed as a contact surface. A second conductive layer is formed on the semiconductor substrate to cover the first and second protective conductive films and to be in contact with the contact surface. By patterning the second conductive layer, the first upper conductive film, the second upper conductive film and the extended portion of the second upper conductive film in contact with the contact surface are formed. A pair of impurity diffusion layers are formed on both sides of the first gate electrode at the surface of the semiconductor substrate.

According to a preferred embodiment of the present invention, patterning of the second conductive layer is performed such that there is a space between an end portion of the extended portion of the second upper conductive film and an end portion of the gate oxide film formed below the first gate electrode.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described in the following with reference to the figures.

First Embodiment

Figure 1:
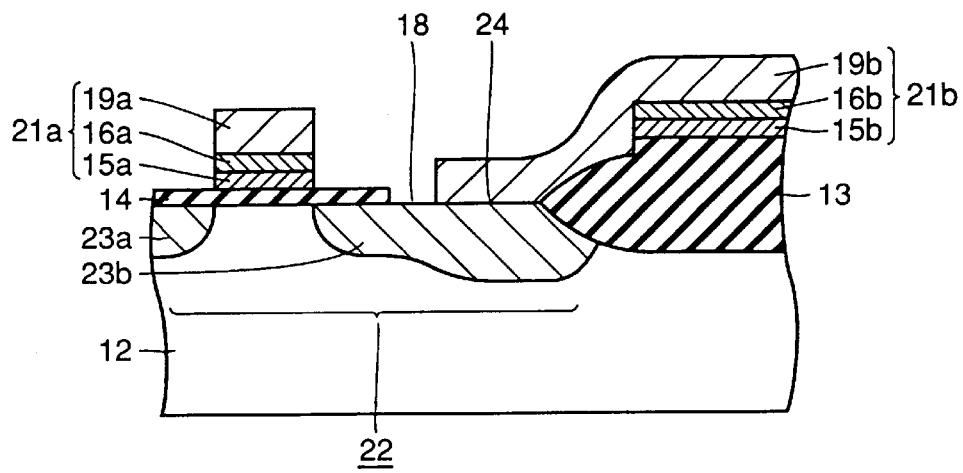
FIG. 1 is a cross section of a semiconductor device in accordance with the present invention.

FIG. 1 is a cross section of a semiconductor device in accordance with the first embodiment.

The semiconductor device in accordance with the first embodiment includes a semiconductor substrate 12. At the main surface of semiconductor substrate 12, an isolation insulating film 13 for isolating an element region from another element region is provided. On semiconductor substrate 12, first and second gate electrodes 21a and 21b are formed spaced from each other. The first gate electrode 21a is a part of an MOS transistor 22. A pair of impurity diffusion layers 23a and 23b are formed on both sides of the first gate electrode 21a at the surface of semiconductor substrate 12. The first gate electrode 21a includes a first lower conductive film 15a provided on semiconductor substrate 12 with a gate oxide film 14 interposed, a first protective conductive film 16a formed on the first lower conductive film 15a, and a first upper conductive film 19a provided on the first protective conductive film 16a. The second gate electrode 21b includes a second lower conductive film 15b, a second protective conductive film 16b provided on the second lower conductive film 15b and a second upper conductive film 19b provided on the second protective conductive film 16b. An end portion of the second upper conductive film 19b extends to be in contact with impurity diffusion layer 23b. An end portion of gate oxide film 14 and an end portion of the extended portion of second conductive film 19b are formed spaced from each other. The region where the end portion of the extended portion of the second upper conductive film 19b and impurity diffusion layer 23b contact is referred to as a direct contact region.

The method of manufacturing the semiconductor device shown in FIG. 1 will be described with reference to FIGS. 2 to 6.

Figure 2:
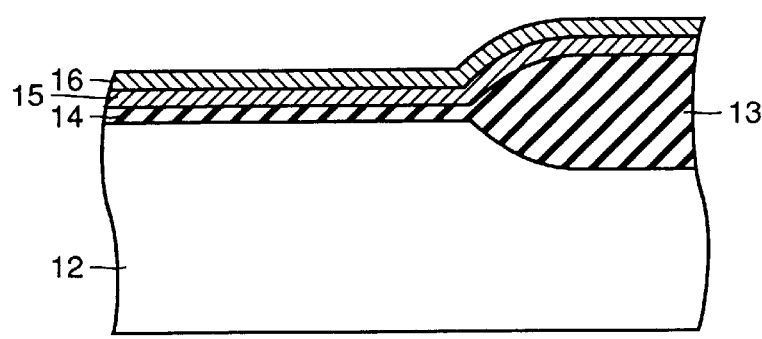
FIGS. 2 to 6 are cross sections of the semiconductor device showing the first to fifth steps of the method of manufacturing a semiconductor device in accordance with the present invention.

Referring to FIG. 2, isolation insulating film 13 is formed by LOCOS method on the main surface of semiconductor substrate 12 of, for example P type silicon single crystal. On the entire upper surface of the semiconductor substrate, gate oxide film 14 is formed by thermal oxidation or the like. Thereafter, on the entire upper surface of the semiconductor substrate 12, a conductive first polycrystalline silicon film 15 doped with an N type impurity is deposited to the thickness of 10 to 50 nm as a first conductive layer, by sputtering or CVD method. On the entire upper surface of the first polycrystalline silicon film 15, a metal silicide film 16 such as tungsten silicide is deposited to the thickness of 20 to 50 nm as the protective conductive layer.

Figure 3:
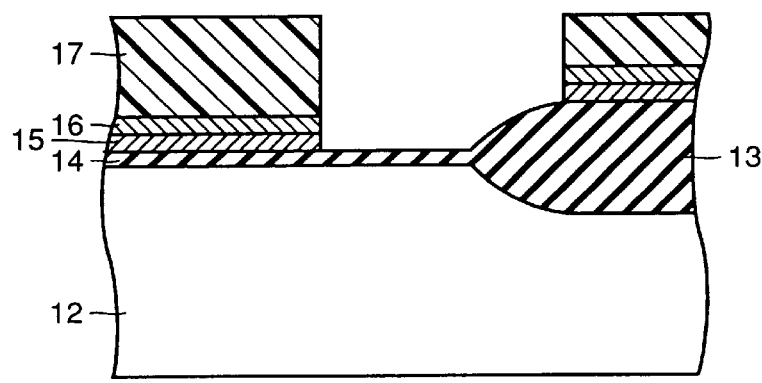

Referring to FIG. 3, a photoresist film is formed on the entire upper surface of the semiconductor substrate, and it is patterned by lithography to form a resist pattern 17. Using resist pattern 17 as a mask, underlying metal silicide film 16 and the first polycrystalline silicon film 15 are removed by etching, for example by ion etching, and an opening is formed to expose a portion of the surface of gate oxide film 14. Thereafter, resist pattern 17 is removed.

Figure 4:
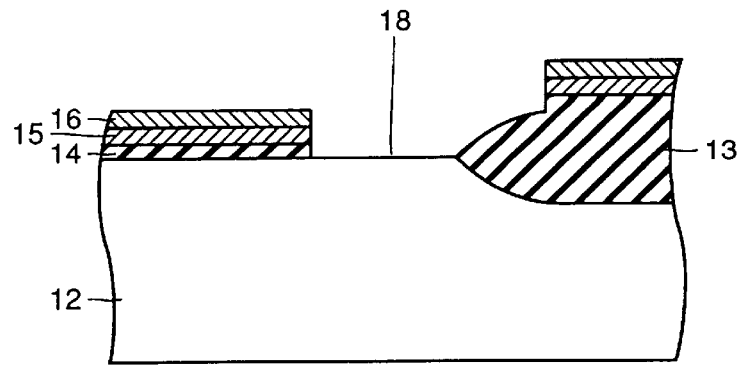

Referring to FIG. 4, by wet etching using hydrofluoric acid, the exposed portion of gate oxide film 14 is removed. Consequently, an opening 18 is selectively formed in gate oxide film 14, exposing the surface of silicon substrate 12.

Figure 5:
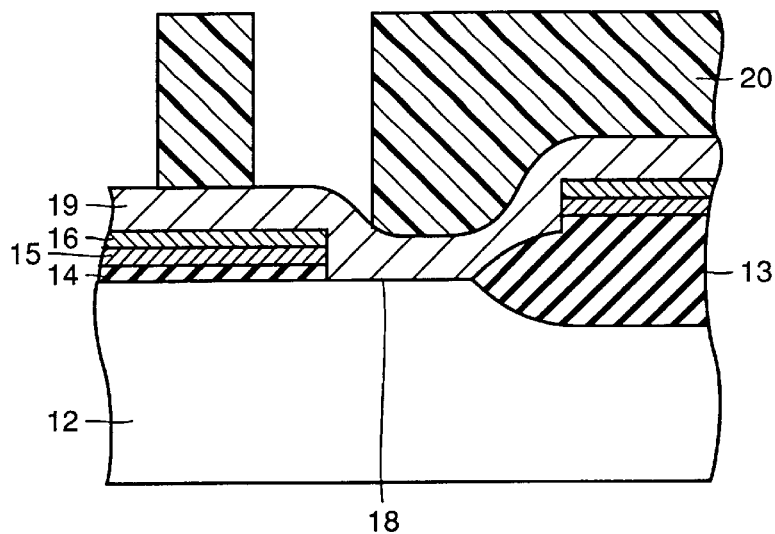

Referring to FIG. 5, a conductive second polycrystalline silicon film 19 doped with an N type impurity is deposited to the thickness of 100 to 200 nm as the second conductive layer, by sputtering or CVD method. Thereafter, a resist pattern 20 is formed on the second polycrystalline silicon film 19. Using resist pattern 20 as a mask, underlying second polycrystalline silicon film 19, metal silicide film 16 and the first polycrystalline silicon film 15 are selectively removed by etching successively, by ion etching or the like. Consequently, gate electrode 21a having three-layered structure consisting of the first polycrystalline silicon film 15a, the metal silicide film 16a and the second polycrystalline silicon film 19a as well as gate electrode 21b having a three-layered structure consisting of the first polycrystalline silicon film 15b, the metal silicide film 16b and the second polycrystalline silicon film 19b are formed. At this time, the extended portion of the second polycrystalline silicon film 19b in contact with the surface of semiconductor substrate 12 is also formed. The patterning is performed such that an end portion of the second polycrystalline silicon film 19b is spaced from the end portion of gate oxide film 14 by about 0.1 μm. Then, resist pattern 20 is removed.

Figure 6:
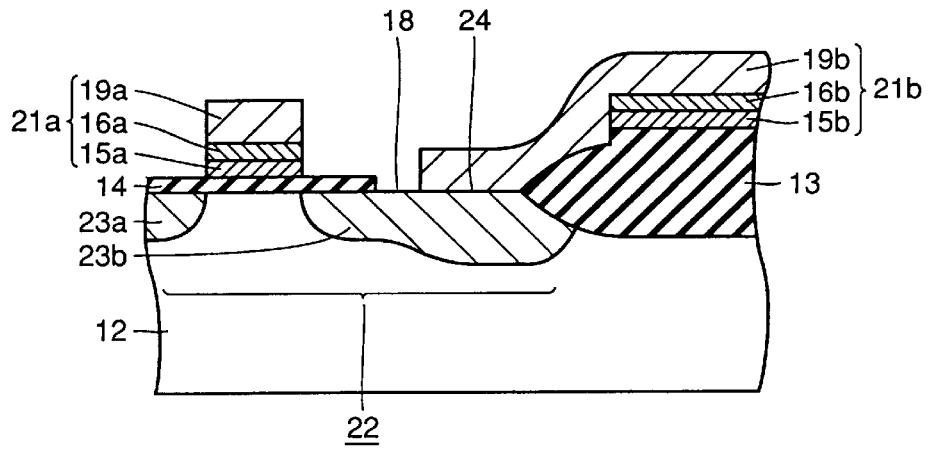

Referring to FIG. 6, by introducing an N type impurity from above semiconductor substrate 12 by ion implantation and by subsequent thermal processing, impurity diffusion layers 23a and 23b which will be source and drain regions of MOS transistor 22 are formed on both sides of gate electrode 21a at the surface of semiconductor substrate 12. During the thermal processing, impurity is also diffused from the second polycrystalline silicon film 19b formed partially in contact with the surface of semiconductor substrate to semiconductor substrate 12 through the contact region (hereinafter referred to as direct contact region 24) with the semiconductor substrate 12. The implanted impurity and the impurity diffused from the second polycrystalline silicon film 19b are integrated, providing impurity diffusion layer 23b. Accordingly, one impurity diffusion layer 23b of MOS transistor 22 is directly connected to the gate electrode 21b of the adjacent MOS transistor at direct contact region 24. Thereafter, through prescribed processes, a semiconductor device is completed.

In the present embodiment, gate electrode 21a (21b) has a three-layered structure in which metal silicide film 16a (16b) is positioned between polycrystalline silicon film 15a (15b) and polycrystalline silicon film 19a (19b), the uppermost layer, that is, the second polycrystalline silicon film 19b is used as an interconnection and is directly connected to impurity diffusion layer 23b. In such a structure, referring to FIG. 4, at the time of etching for forming opening 18 in gate oxide film 14, the first polycrystalline silicon film 15 has its surface covered by metal silicide film 16, and therefore it is not exposed to the etchant. Therefore, water marks are not generated on the first polycrystalline silicon film 15.

Generation of water marks is likely on the surface of silicon or polycrystalline silicon film, and water marks are not substantially generated on the surface of metal silicide film 16 even when it is exposed to an etchant containing hydrofluoric acid.

Figure 12:
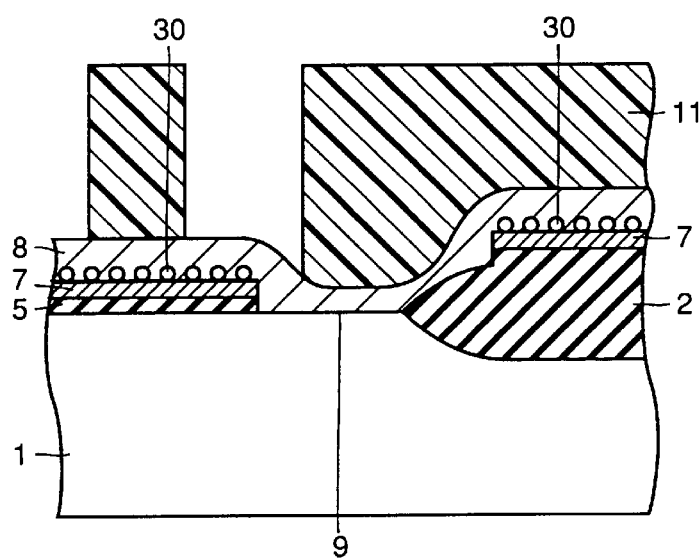
Figure 13:
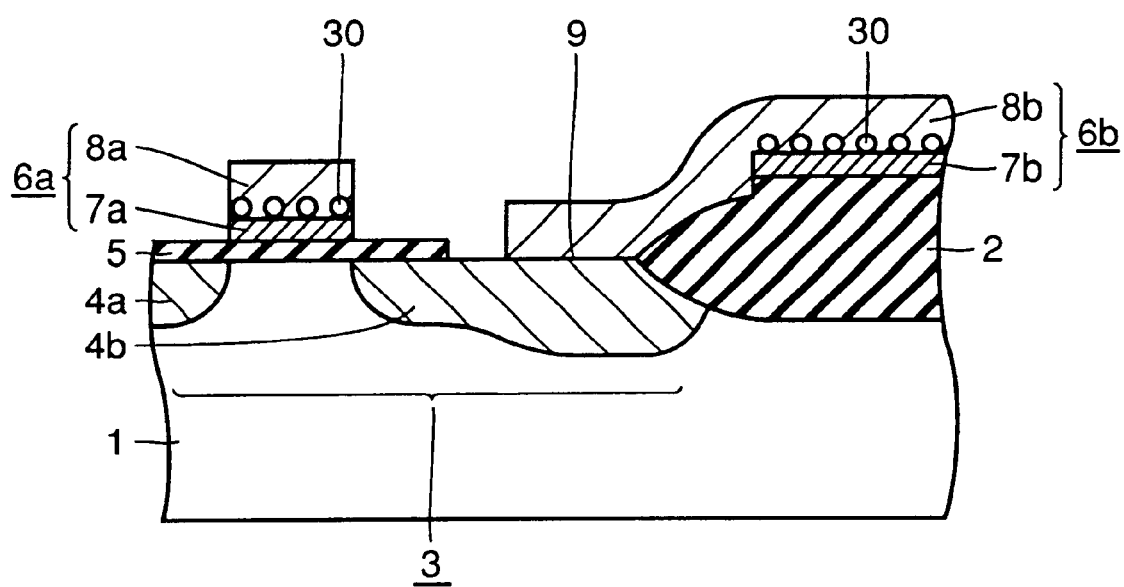

Accordingly, comparing FIGS. 5 and 12, the conventional problem that after the second polycrystalline silicon film 19 is deposited on the entire upper surface of semiconductor substrate 12 and gate electrodes 21a and 21b are patterned, pattern defects are caused as water marks function as a masks, can be prevented.

In this manner, according to the present invention, wet etching which does not cause any damage on semiconductor substrate 12 can be used, and pattern defects of gate electrodes 21a and 21b caused by the water marks can be prevented.

Further, as metal silicide film 16a (16b) is formed between the first and second polycrystalline silicon films 15a, 19a (15b, 19b) constituting gate electrode 21a (21b), resistance of gate electrodes 21a and 21b can be reduced.

Further, as compared with the case where polycrystalline silicon only is used, increase in grain diameter constituting the crystal can be prevented, and therefore at the time of ion implantation, entrance of impurity penetrating through gate electrodes 21a and 21b to the underlying semiconductor substrate 12 can be prevented.

Further, according to the present invention, referring to FIG. 6, when gate electrodes 21a and 21b are patterned, the end portion of the extended portion of the second polycrystalline silicon film 19b is patterned to be spaced by about 0.1 μm from the end portion of gate oxide film 14. By this margin of about 0.1 μm in photolithography, the extended portion of the second polycrystalline silicon film 19b will never extend onto the gate oxide film 14. Therefore, even when impurity diffusion layers 23a and 23b are formed by ion implantation and thermal processing subsequently, the impurity diffusion region formed by implantation and the diffusion region formed by impurity diffusion from the second polycrystalline silicon film 19b through direct contact region 24 to semiconductor substrate 12 are not isolated from each other, and an integrated impurity diffusion layer 23b can be formed. Therefore, the impurity diffusion region can be prevented from having an offset structure.

Referring to FIG. 6, at the time of dry etching for patterning gate electrodes 21a and 21b, the surface of semiconductor substrate 12 is removed to some extent at the end portion of the second polycrystalline silicon film 19b, generally by about 0.1 μm. Since impurity diffusion layer 23b has sufficient depth (of about 0.3 μm, for example), semiconductor characteristics are not affected.

Referring to FIG. 4, other than tungsten silicide, a silicide film of a metal having high melting point such as titanium, cobalt, molybdenum or the like may be used as metal silicide film 16, and similar effects can be obtained. Metal silicide film 16 may be formed by deposition through sputtering or CVD method, or it may be formed by forming a film of metal having high melting point and siliciding the same.

Further, in place of the metal silicide film, a film of metal having high melting point such as tungsten, titanium, cobalt, molybdenum or the like may be used as it is, and similar effects of preventing generation of water marks can be obtained. In that case, use of metal film is inferior to some extent in consistency with the process for forming the device, to metal silicide film. However, resistance of gate electrodes 21a and 21b can further be reduced.

Further, according to the present invention, impurity doped first and second polycrystalline silicon films 15 and 19 are deposited as shown in FIGS. 2 and 5. However, the present invention is not limited thereto. After forming the first and second polycrystalline silicon films 15 and 19, impurity may further be introduced by ion implantation or the like. Further, though an NMOS transistor has been described, similar effects can be obtained in a PMOS transistor.

Second Embodiment

In the first embodiment, gate electrodes 21a and 21b have three-layered structure. It may have multilayered structure including four or more layers.

Figure 7:
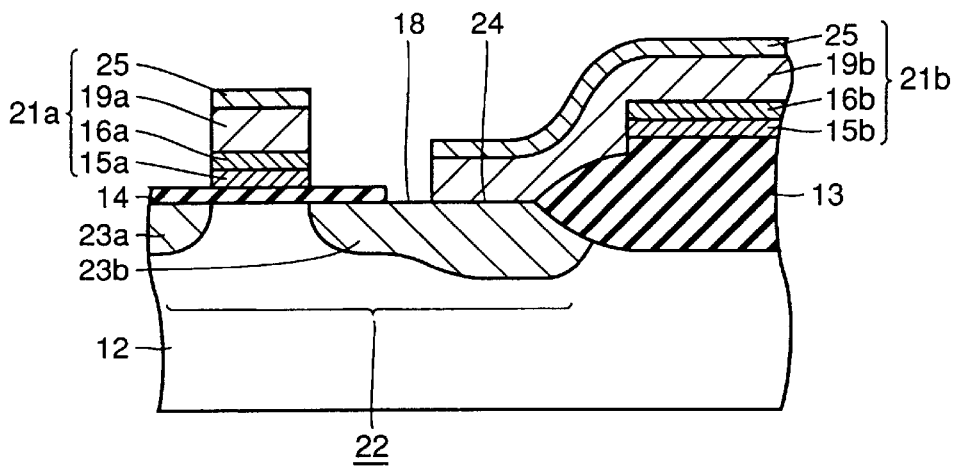
FIG. 7 is a cross section of a semiconductor device in accordance with another embodiment of the present invention.
Figure 8:
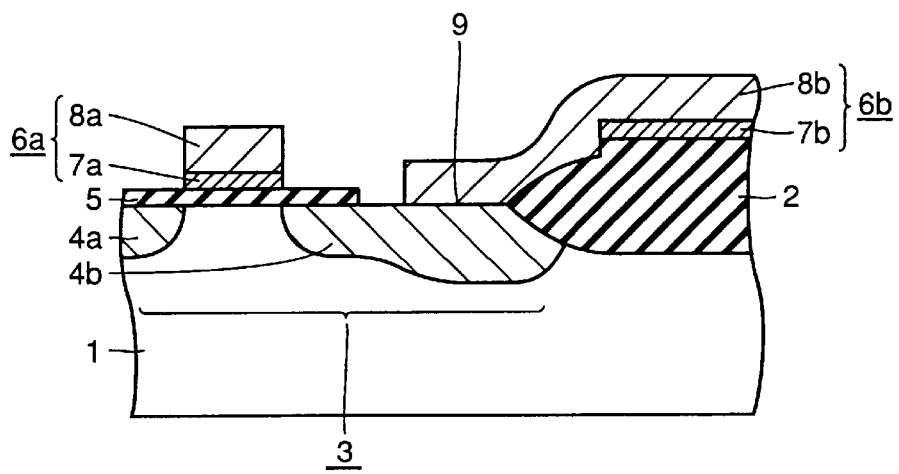
FIG. 8 is a cross section of a conventional semiconductor device.
Figure 9:
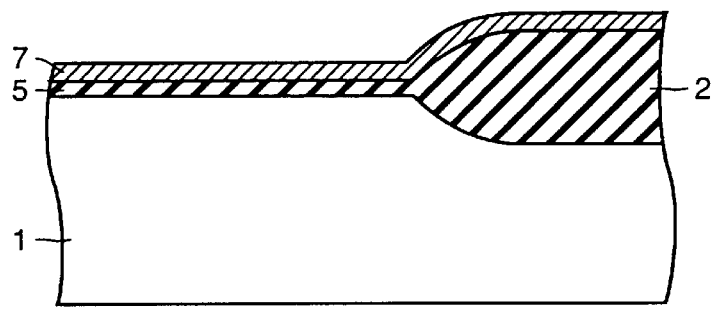
FIGS. 9 to 13 are cross sections showing the first to fifth steps of the method of manufacturing the conventional semiconductor device.
Figure 10:
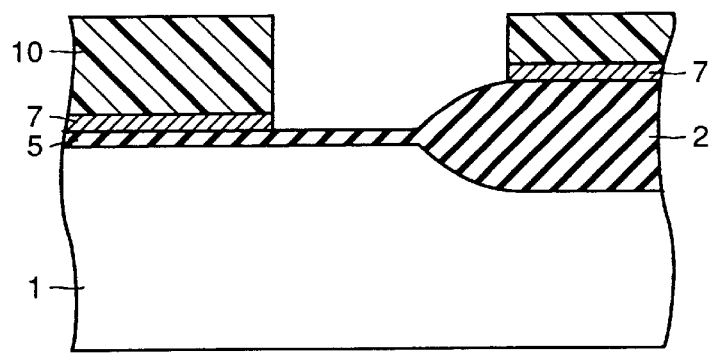
Figure 11:
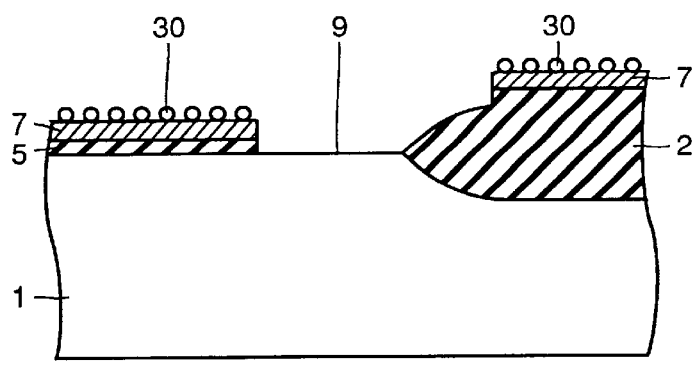

FIG. 7 is a cross section of the semiconductor device in accordance with the second embodiment. In the semiconductor device shown in FIG. 7, portions corresponding to those of FIG. 1 are denoted by the same reference characters and description thereof is not repeated.

In the second embodiment, a metal silicide film 25 is further formed on gate electrode 21a and metal silicide film 25 is also formed on the surface of gate electrode 21b. By the presence of metal silicide film 25, overall resistance of gate electrodes 21a and 21b can further be reduced, and contact resistance with an upper interconnection layer can be reduced.

Further, though a single layer of polycrystalline silicon film is used as the first conductive layer 15, a stacked film having an uppermost layer formed of polycrystalline silicon film may be used as the first conductive layer and similar effects can be obtained. Further, though a polycrystalline silicon film is used as the first conductive layer as an example, the present invention is not limited thereto. When the method in accordance with the present invention is applied to any mark on which surface generation of water marks is likely, generation of water marks can be prevented.

EFFECTS OF THE INVENTION

As described above, in the semiconductor device in accordance with the present invention, the first gate electrode includes a first lower conductive film and a first upper conductive film with a first protective conductive film interposed between the first lower conductive film and the first upper conductive film, so that resistance of the gate electrode can be reduced. Further, at the time of ion implantation, piercing of impurity through gate electrode can be prevented. Therefore, highly reliable semiconductor device having high performance can be obtained.

In the method of manufacturing a semiconductor device in accordance with the present invention, a protective conductive film is formed to cover the surface of the first conductive layer. Therefore, when the first conductive layer is etched, water marks are not generated on the surface of the first conductive layer. Accordingly, pattern defects of the gate electrode can be prevented. Further, as the protective conductive film is added, the resistance of the gate electrode can be reduced. Further, penetration of impurities through gate electrode into the semiconductor substrate can be prevented. Accordingly, a highly reliable semiconductor device having high performance can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:

a semiconductor substrate:
  first and second gate electrodes formed spaced from each other on said semiconductor substrate; and
  a pair of impurity diffusion layers formed on both sides of said first gate electrode at a surface of said semiconductor substrate; wherein
  said first gate electrode includes a first lower conductive film comprising a first conductive material, a first intermediate conductive film provided on said first lower conductive film and an upper conductive film comprising the first conductive material provided on said first intermediate conductive film,
  said second gate electrode includes a second lower conductive film, a second intermediate conductive film provided on said second lower conductive film, and a second upper conductive film formed on said second intermediate film, and
  said second upper conductive film extends to be in contact with one of said pair of impurity diffusion layers.

2. The semiconductor device according to claim 1, further comprising a gate oxide film provide between said first gate electrode and said semiconductor substrate; wherein
  an end portion of said gate oxide film and an end portion of said extended portion of said second upper conductive film which is in contact with said impurity diffusion layer are formed spaced from each other.

3. The semiconductor device according to claim 1, wherein
  a metal silicide film is further provided on each of said first upper conductive film and said second upper conductive film.

4. The semiconductor device according to claim 1, wherein
  said first and second intermediate conductive films are formed of a metal silicide film or a film of refractory metal.

5. The semiconductor device according to claim 1, wherein the first conductive material is polysilicon.

* * * * *